United States Patent
Jiang et al.

(10) Patent No.: US 10,731,114 B2
(45) Date of Patent: Aug. 4, 2020

(54) SULFOXIDE/GLYCOL ETHER BASED SOLVENTS FOR USE IN THE ELECTRONICS INDUSTRY

(71) Applicant: Dow Global Technologies LLC, Midland, MI (US)

(72) Inventors: Qi Jiang, Shanghai (CN); Xin Jiang, Shanghai (CN); Hua Ren, Shanghai (CN); Eungkyu Kim, Midland, MI (US); Jianhai Mu, Shanghai (CN); Kaoru Ohba, Tokyo (JP)

(73) Assignee: Dow Global Technologies LLC, Midland, MI (US)

( * ) Notice: Subject to any disclaimer, the term of this patent is extended or adjusted under 35 U.S.C. 154(b) by 0 days.

(21) Appl. No.: 15/544,310

(22) PCT Filed: Jan. 20, 2017

(86) PCT No.: PCT/CN2017/071798
§ 371 (c)(1),
(2) Date: Jul. 18, 2017

(87) PCT Pub. No.: WO2018/058866
PCT Pub. Date: Apr. 5, 2018

(65) Prior Publication Data
US 2019/0211286 A1    Jul. 11, 2019

(30) Foreign Application Priority Data
Sep. 28, 2016 (WO) ................ PCT/CN2016/100460

(51) Int. Cl.
| | |
|---|---|
| C11D 7/32 | (2006.01) |
| C11D 7/34 | (2006.01) |
| C11D 7/26 | (2006.01) |
| C11D 7/50 | (2006.01) |
| C11D 11/00 | (2006.01) |
| G03F 7/42 | (2006.01) |
| C11D 3/43 | (2006.01) |
| C11D 3/34 | (2006.01) |
| C11D 3/36 | (2006.01) |
| C11D 3/20 | (2006.01) |
| C11D 3/32 | (2006.01) |
| C11D 3/28 | (2006.01) |

(52) U.S. Cl.
CPC .......... *C11D 7/5009* (2013.01); *C11D 3/2068* (2013.01); *C11D 3/28* (2013.01); *C11D 3/32* (2013.01); *C11D 3/3445* (2013.01); *C11D 3/362* (2013.01); *C11D 3/43* (2013.01); *C11D 7/5013* (2013.01); *C11D 7/5022* (2013.01); *C11D 11/0047* (2013.01); *G03F 7/425* (2013.01); *G03F 7/426* (2013.01)

(58) Field of Classification Search
CPC ........... C11D 3/28; C11D 3/2068; C11D 3/32; C11D 3/3445; C11D 3/362
USPC ....... 510/175, 176, 492, 499, 500, 501, 505, 510/506
See application file for complete search history.

(56) References Cited

U.S. PATENT DOCUMENTS

| | | | | |
|---|---|---|---|---|
| 5,556,482 | A * | 9/1996 | Ward | C09D 9/005 134/2 |
| 5,707,947 | A * | 1/1998 | Ward | C09D 9/005 134/2 |
| 7,960,328 | B2 | 6/2011 | Visintin et al. | |
| 2003/0138710 | A1 | 7/2003 | Park et al. | |
| 2006/0003910 | A1 | 1/2006 | Hsu et al. | |
| 2013/0296214 | A1* | 11/2013 | Barnes | H01L 21/02063 510/176 |
| 2013/0330927 | A1* | 12/2013 | Kumagai | G03F 7/425 438/675 |
| 2014/0018281 | A1* | 1/2014 | Kumagai | C23G 1/26 510/255 |
| 2014/0100151 | A1* | 4/2014 | Egbe | G03F 7/422 510/176 |
| 2015/0044839 | A1 | 2/2015 | Braun et al. | |
| 2015/0252311 | A1* | 9/2015 | Takahashi | C11D 7/08 438/720 |
| 2015/0307818 | A1* | 10/2015 | Barnes | H01L 21/02063 510/175 |
| 2016/0254140 | A1* | 9/2016 | Saito | C07F 9/3808 134/22.19 |
| 2017/0115573 | A1 | 4/2017 | Park et al. | |
| 2017/0200601 | A1* | 7/2017 | Song | H01L 21/02063 |

FOREIGN PATENT DOCUMENTS

| | | |
|---|---|---|
| CN | 101000468 B | 7/2007 |
| CN | 101866118 A | 10/2010 |
| CN | 102382319 B | 3/2012 |
| CN | 103293883 A | 9/2013 |

(Continued)

*Primary Examiner* — Gregory R Delcotto
(74) *Attorney, Agent, or Firm* — Quarles & Brady LLP

(57) ABSTRACT

Solvents useful for removing, among other things, photoresists and poly(amic acid)/polyimide from display/semiconductor substrates or electronic processing equipment, consist essentially of:

(A) a first component consisting of a sulfoxide, e.g., DMSO;

(B) a second component consisting of a glycol ether, e.g., ethylene glycol monobutyl ether; and (C) a third component consisting of at least one of N-formyl morpholine, N,N-dimethyl propionamide, 3-methoxy-N,N-dimethyl propanamide, triethyl phosphate, N,N-dimethyl acetamide; N,N-diethyl acetamide, N,N-diethyl propionamide, N-methyl acetamide, N-methyl propionamide, N-ethyl acetamide, and N-ethyl propionamide.

4 Claims, No Drawings

(56) References Cited

FOREIGN PATENT DOCUMENTS

| | | | |
|---|---|---|---|
| CN | 103424999 | A | 12/2013 |
| JP | 2005331913 | A | 12/2005 |
| JP | 2011105814 | A | 6/2011 |
| JP | 5195063 | B2 | 5/2013 |

* cited by examiner

SULFOXIDE/GLYCOL ETHER BASED SOLVENTS FOR USE IN THE ELECTRONICS INDUSTRY

FIELD

This invention relates to ecology-friendly solvents ("eco-solvents") useful in the manufacture of various electronic components, e.g., display units and semiconductors.

BACKGROUND

Some polar solvents, e.g., N-methyl-2-pyrrolidone (NMP), dimethyl acetamide (DMAc), dimethyl formamide (DMF), etc., have reproductive toxicity, which drive the ever increasing global safety and regulatory concerns related to these materials. For example, NMP is listed in the Substance of Very High Concerns (SVHC) registry of the European Globally Harmonized System of Classification and Labeling of Chemicals (GHS) and REACH Annex XVII which lists the restrictions on the manufacture, placing on the market and use of certain dangerous substances, mixtures and articles.

NMP is used in the electronics industry for cleaning and stripping of various parts (e.g., components for display units, semiconductor substrates, etc.) and equipment, and considerable amounts of it are consumed annually. Developing an eco-solvent to achieve similar performance with a better environmental profile than NMP is an urgent request from electronic processing customers. This invention details solvent combinations that, in some embodiments, provide the same or better cleaning ability, and stripping ability for photoresist removal, than NMP.

SUMMARY

In one embodiment the invention is a solvent consisting essentially of:
and
(A) a first component consisting of a sulfoxide;
(B) a second component consisting of a glycol ether; and
(C) a third component consisting of at least one of N-formyl morpholine, N,N-dimethyl propionamide, 3-methoxy-N,N-dimethyl propanamide, triethyl phosphate, N,N-dimethyl acetamide; N,N-diethyl acetamide, N,N-diethyl propionamide, N-methyl acetamide, N-methyl propionamide, N-ethyl acetamide, and N-ethyl propionamide.

In one embodiment the invention is a process for cleaning or stripping the surface of a substrate, the process comprising the step of contacting the substrate with a solvent consisting essentially of:
(A) a first component consisting of a sulfoxide;
(B) a second component consisting of a glycol ether; and
(C) a third component consisting of at least one of N-formyl morpholine, N,N-dimethyl propionamide, 3-methoxy-N,N-dimethyl propanamide, triethyl phosphate, N,N-dimethyl acetamide; N,N-diethyl acetamide, N,N-diethyl propionamide, N-methyl acetamide, N-methyl propionamide, N-ethyl acetamide, and N-ethyl propionamide.

DETAILED DESCRIPTION

Definitions

For purposes of United States patent practice, the contents of any referenced patent, patent application or publication are incorporated by reference in their entirety (or its equivalent U.S. version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1 to 7), any subrange between any two explicit values is included (e.g., 1 to 2; 2 to 6; 5 to 7; 3 to 7; 5 to 6; etc.).

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed. The term "or," unless stated otherwise, refers to the listed members individually as well as in any combination. Use of the singular includes use of the plural and vice versa.

Unless stated to the contrary, implicit from the context, or customary in the art, all parts and percents are based on weight and all test methods are current as of the filing date of this disclosure.

"Solvent" and like terms mean a substance that is capable of dissolving another substance (i.e., a solute) to form an essentially uniformly dispersed mixture (i.e., solution) at the molecular or ionic size level.

"Electronic part" and like terms mean an in-process or finished product, or component of a product, of a manufacturing process for electronic goods, such as a semiconductor or display unit. Electronic part, as used in the context of this invention, includes the equipment used to manufacture the product.

"In-process product" and like terms mean an unfinished or intermediate product. In-process products include starting materials, e.g., materials as received from vendors, or materials before subjected to the start of the manufacturing process.

"Photoresist" and like terms mean a photosensitive resin that loses its resistance to chemical etching when exposed to radiation and is used especially in the transference of a circuit pattern to a semiconductor chip during the production of an integrated circuit.

"Cleaning" and like terms mean, in the context of this invention, the removal of particulate contamination and metal ions from the surface of a substrate, usually from the surface of an in-process electronic part to ready the part for subsequent processing.

"Stripping" and like terms mean, in the context of this invention, the removal of a layer, e.g., coating or film, from the surface of a substrate, such as the removal of a photoresist from the surface of a semiconductor substrate.

"Freezing point" and like terms mean the temperature at which a liquid changes into a solid. The freezing point of the solvents of this invention can be determined by using test equipment that includes a glass container, cooling bath or cooling trap or refrigerator with temperature control system, and thermometer or thermal sensor. A twenty gram (20 g) sample of liquid solvent is placed in a glass container, e.g., a glass cylinder. The temperature of the cooling bath or cooling trap or refrigerator is set at 0° C. A thermometer or thermal sensor is used to determine the temperature of cold liquid or cold airflow inside of cooling bath or cooling trap or refrigerator. The glass container with prepared solvent sample is stored in the cooling bath or cooling trap for at least 12 hours. The freezing point of the solvent sample is determined by observing its physical state, i.e., liquid or solid. If the solvent sample still shows fluidity, the current setting temperature of the cooling bath or cooling trap or refrigerator is reduced until its temperature determined by thermometer or thermal sensor is 1° C. less than its previous temperature. The procedure is repeated until the solvent sample is solid.

Poly(amic acid) is an intermediate polymer in the synthesis of polyimide. It is soluble in polar solvents due to strong hydrogen bonding.

Polyimide (PI) is a polymer of imide monomers. It is normally produced by the reaction of a dianhydride and a diamine. One common PI used in the electronics industry is KAPTON™ It is produced from the condensation of pyromellitic dianhydride and 4,4'-oxydiphenylamine.

Solvents

The solvents of this invention consist essentially of a first component, a second component, and a third component. The first component consists of, or is, a sulfoxide. The second component consists of, or is, a glycol ether. The third component consists of, or consists essentially of, at least one of N-formyl morpholine (CAS Number 4394-85-8), N,N-dimethyl propionamide (CAS Number 758-96-3), 3-methoxy-N,N-dimethyl propanamide (CAS Number 53185-52-7), triethyl phosphate (CAS Number 78-40-0), N,N-dimethyl acetamide (CAS Number 127-19-5); N,N-diethyl acetamide (CAS Number 685-91-6), N,N-diethyl propionamide (CAS Number 1114-51-8), N-methyl acetamide (CAS Number 79-16-3), N-methyl propionamide (CAS Number 1187-58-2), N-ethyl acetamide (CAS Number 625-50-3), and N-ethyl propionamide (CAS Number 5129-72-6). The first, second and third components form a blend, and the blend may or may not be phase separated. In one embodiment the solvent has a freezing point of less than −25° C.

Sulfoxides

The first component of the solvent of this invention consists of, or is, a sulfoxide, i.e., a compound containing a sulfinyl functional group attached to two carbon atoms. It is a polar functional group. Sulfoxides are the oxidized derivatives of sulfides. Representative sulfoxides include, but are not limited to, diethyl sulfoxide, butyl sulfoxide, tetramethylene sulfoxide and dimethyl sulfoxide (DMSO). The first component can consist of one or more sulfoxides. In one embodiment the first component consists of one sulfoxide. In one embodiment the first component consists of two or more sulfoxides. In one embodiment the first component consists of, or is, DMSO (CAS Number 67-68-5).

Glycol Ethers

The second component of the solvent of this invention consists of, or is, a glycol ether, i.e., a compound based on an alkyl ether of ethylene glycol or propylene glycol. These solvents typically have a higher boiling point, together with the favorable solvent properties of lower-molecular weight ethers and alcohols. Representative glycol ethers include, but are not limited to, ethylene glycol monobutyl ether, ethylene glycol monopropyl ether, diethylene glycol monoethyl ether, propylene glycol monomethyl ether, dipropylene glycol monomethyl ether, and tripropylene glycol monomethyl ether. The second component can consist of one or more glycol ethers. In one embodiment the second component consists of one glycol ether. In one embodiment the second component consists of two or more glycol ethers. In one embodiment the second component is an ethylene glycol alkyl ether. In one embodiment the second component is a propylene glycol alkyl ether. In one embodiment the alkyl component of the ethylene or propylene glycol ether is an alkyl group of 2 to 12, or 3 to 10, or 3 to 8, carbon atoms. In one embodiment the second component consists of, or is, ethylene glycol monobutyl ether (CAS Number 111-76-2).

Embodiments

In one embodiment the solvent is a blend consisting of, or consisting essentially of, a sulfoxide as the first component, a glycol ether as the second component, and N-formyl morpholine as the third component.

In one embodiment the solvent is a blend consisting of, or consisting essentially of, a sulfoxide as the first component, a glycol ether as the second component, and N,N-dimethyl propionamide as the third component.

In one embodiment the solvent is a blend consisting of, or consisting essentially of, a sulfoxide as the first component, a glycol ether as the second component, and 3-methoxy-N,N-dimethyl propanamide as the third component.

In one embodiment the solvent is a blend consisting of, or consisting essentially of, a sulfoxide as the first component, a glycol ether as the second component, and triethyl phosphate as the third component.

In one embodiment the solvent is a blend consisting of, or consisting essentially of, DMSO as the first component, a glycol ether as the second component, and N-formyl morpholine as the third component.

In one embodiment the solvent is a blend consisting of, or consisting essentially of, DMSO as the first component, a glycol ether as the second component, and N,N-dimethyl propionamide as the third component.

In one embodiment the solvent is a blend consisting of, or consisting essentially of, DMSO as the first component, a glycol ether as the second component, and 3-methoxy-N,N-dimethyl propanamide as the third component.

In one embodiment the solvent is a blend consisting of, or consisting essentially of, DMSO as the first component, a glycol ether as the second component, and triethyl phosphate as the third component.

In one embodiment the solvent is a blend consisting of, or consisting essentially of, a sulfoxide as the first component, ethylene glycol monobutyl ether as the second component, and N-formyl morpholine as the third component.

In one embodiment the solvent is a blend consisting of, or consisting essentially of, a sulfoxide as the first component, ethylene glycol monobutyl ether as the second component, and N,N-dimethyl propionamide as the third component.

In one embodiment the solvent is a blend consisting of, or consisting essentially of, a sulfoxide as the first component, ethylene glycol monobutyl ether as the second component, and 3-methoxy-N,N-dimethyl propanamide as the third component.

In one embodiment the solvent is a blend consisting of, or consisting essentially of, a sulfoxide as the first component, ethylene glycol monobutyl ether as the second component, and triethyl phosphate as the third component.

In one embodiment the solvent is a tertiary blend consisting of, or consisting essentially of, DMSO as the first component, ethylene glycol monobutyl ether as the second component, and N-formyl morpholine as the third component.

In one embodiment the solvent is a tertiary blend consisting of, or consisting essentially of, DMSO as the first component, ethylene glycol monobutyl ether as the second component, and N,N-dimethyl propionamide as the third component.

In one embodiment the solvent is a tertiary blend consisting of, or consisting essentially of, DMSO as the first component, ethylene glycol monobutyl ether as the second component, and 3-methoxy-N,N-dimethyl propanamide as the third component.

In one embodiment the solvent is a tertiary blend consisting of, or consisting essentially, of DMSO as the first component, ethylene glycol monobutyl ether as the second component, and triethyl phosphate as the third component.

In one embodiment the solvent is a quaternary blend consisting of, or consisting essentially of, DMSO as the first component, ethylene glycol monobutyl ether as the second component, and a combination of N-formyl morpholine and N,N-dimethyl propionamide as the third component.

In one embodiment the solvent is a quaternary blend consisting of, or consisting essentially of, DMSO as the first component, ethylene glycol monobutyl ether as the second component, and a combination of N-formyl morpholine and 3-methoxy-N,N-dimethyl propanamide as the third component.

In one embodiment the solvent is a quaternary blend consisting of, or consisting essentially of, DMSO as the first component, ethylene glycol monobutyl ether as the second component, and a combination of N-formyl morpholine and triethyl phosphate as the third component.

In one embodiment the solvent is a quaternary blend consisting of, or consisting essentially of, DMSO as the first component, ethylene glycol monobutyl ether as the second component, and a combination of N,N-dimethyl propionamide and 3-methoxy-N,N-dimethyl propanamide as the third component.

In one embodiment the solvent is a quaternary blend consisting of, or consisting essentially of, DMSO as the first component, ethylene glycol monobutyl ether as the second component, and a combination of N,N-dimethyl propionamide and triethyl phosphate as the third component.

In one embodiment the solvent is a quinary blend consisting of, or consisting essentially of, DMSO as the first component, ethylene glycol monobutyl ether as the second component, and a combination of N-formyl morpholine, N,N-dimethyl propionamide and 3-methoxy-N,N-dimethyl propanamide as the third component.

In one embodiment the solvent is a quinary blend consisting of, or consisting essentially of, DMSO as the first component, ethylene glycol monobutyl ether as the second component, and a combination of N-formyl morpholine, N,N-dimethyl propionamide and triethyl phosphate as the third component.

In one embodiment the solvent is a quinary blend consisting of, or consisting essentially of, DMSO as the first component, ethylene glycol monobutyl ether as the second component, and a combination of N,N-dimethyl propionamide, 3-methoxy-N,N-dimethyl propanamide and triethyl phosphate as the third component.

In one embodiment the solvent is a senary blend consisting of, or consisting essentially of, DMSO as the first component, ethylene glycol monobutyl ether as the second component, and a combination of N-formyl morpholine, N,N-dimethyl propionamide, 3-methoxy-N,N-dimethyl propanamide and triethyl phosphate as the third component.

In one embodiment the solvent consists of, or consists essentially of, in weight percent (wt %) based on the weight of the solvent, from 50 to 90 wt % of the first component, from 9 to 40 wt % of the second component, and from 1 to 30 wt % of the third component.

In one embodiment the solvent consists of, or consists essentially of, in weight percent (wt %) based on the weight of the solvent, from 50 to 90 wt % of DMSO, from 9 to 40 wt % of ethylene glycol monobutyl ether, and from 1 to 30 wt % of at least one of N-formyl morpholine, N,N-dimethyl propionamide, 3-methoxy-N,N-dimethyl propanamide and triethyl phosphate as the third component.

In one embodiment the solvent consists of, or consists essentially of, in weight percent (wt %) based on the weight of the solvent, from 10 to 30 wt % of the first component, from 1 to 30 wt % of the second component, and from 70 to 90 wt % of the third component.

In one embodiment the solvent consists of, or consists essentially of, in weight percent (wt %) based on the weight of the solvent, from 10 to 30 wt % of DMSO, from 10 to 30 wt % of ethylene glycol monobutyl ether, and from 70 to 90 wt % of at least one of N-formyl morpholine, N,N-dimethyl propionamide, 3-methoxy-N,N-dimethyl propanamide, triethyl phosphate, N,N-dimethyl acetamide; N,N-diethyl acetamide, N,N-diethyl propionamide, N-methyl acetamide, N-methyl propionamide, N-ethyl acetamide, and N-ethyl propionamide as the third component.

In one embodiment the solvent consists of, or consists essentially of, in weight percent (wt %) based on the weight of the solvent, from 10 to 30 wt % of DMSO, from 10 to 30 wt % of ethylene glycol monobutyl ether, and from 70 to 90 wt % of N,N-dimethyl propionamide, as the third component.

In one embodiment the solvent has a freezing point of less than (<)−25° C., or <−20° C., or <−15° C., or <−10° C. In one embodiment the solvent has a freezing point from −25° C. or less to −10° C. or more.

In those embodiments in which the third component consists of more than one substance, e.g., the third component consists essentially of N-formyl morpholine and N,N-dimethyl propionamide and/or 3-methoxy-N,N-dimethyl propanamide and/or triethyl phosphate, etc., the amount of each compound in the third component can vary widely and to convenience. The amount of each individual substance in the third component can vary from 0 to 100 wt %, or from 1 to 99 wt %, or from 10 to 90 wt %, or from 20 to 80 wt % or from 30 to 70 wt %, or from 40 to 60 wt %, or 50 wt %, based on the weight of the component.

Optional materials that are not essential to the operability of, but can be included in, the solvents of this invention include, but are not limited to, antioxidants, colorants, water scavengers, stabilizers, and the like. These materials do not have any material impact on the efficacy of the solvent for cleaning or stripping electronic parts. These optional materials are used in known amounts, e.g., 0.10 to 5, or 4, or 3, or 2, or 1, weight percent based on the weight of the solvent, and they are used in known ways.

Preparation of the Solvent

The solvents of this invention are made using known equipment and known techniques. The individual components of the solvent are commercially available, liquid at ambient conditions (23° C. and atmospheric pressure), and can simply be mixed with one another using conventional mixing equipment and standard blending protocols. The components can be added to one another in any order including simultaneously.

Use of the Solvents

The solvents of this invention are eco-solvents, i.e., they do not have, or have at a reduced level, the toxicology issues associated with NMP. These solvents are useful for cleaning and/or stripping the surfaces of substrates of contaminants and other unwanted substances, particularly polar contaminants and polar unwanted substances.

In one embodiment the solvents of this invention are intended as a replacement for NMP and other polar solvents used in the electronics industry. As such, they are used in the same manner as NMP and the other polar solvents in such operations as cleaning and stripping of electronic parts and equipment, and the removal of photoresists from various substrates, e.g., semiconductor substrates, and the removal of polyamic acid polymer residue from polyimide coating equipment, e.g., alignment layer and flexible display substrate coating machine. Typically, these methods or processes include the step of contacting the object or substrate to be cleaned or stripped, or from which a photoresist or a polyamic acid/polyimide residue is to be removed, with the solvent under any of various conditions, e.g., ambient conditions, or at an elevated or reduced temperature, with or without flow or agitation, e.g., printing, spinning, immersing, flushing, vibrating, showering, spraying, etc., for a sufficient period of time to dissolve whatever material, e.g., a contaminant such as poly(amic acid)/polyimide residue, dianhydride, diamine, etc.; a photoresist, and the like, that is to be removed. This contacting step is then typically followed by rinse (one or more, typically with an aqueous liquid such as deionized water) and drying steps. Solvents with a freezing temperature of less than −25° C. can be particularly favored for use in the processes of cleaning and/or stripping electronic parts and equipment.

The following examples are nonlimiting illustrations of the invention.

EXAMPLES

Materials

Poly(amic acid), precursor of polyimide: poly (pyromellitic dianhydride-co-4,4'-oxydianiline), amic acid (from Sigma-Aldrich, 15~16 wt % dissolved in NMP).

Photoresist: SFP-1400 (from Merck).

Solvents: N-formyl morpholine (from Accela ChemBio, 98%), dimethyl sulfoxide (DMSO) (from Sinopharm, 99%), triethyl phosphate (from Sinopharm, 99%), 3-methoxy-N,N-dimethyl propanamide (from BOC Science, 98%), N,N-dimethyl propionamide (from Energy Chemical, 98%), and ethylene glycol monobutyl ether (from The Dow Chemical Company, 99%).

Solvents

The solvents are designed according to Hansen Solubility Parameter of NMP, DMF, 3-methoxy-N,N-dimethyl propanamide, etc. These commercialized solvents have strong dissolution ability for most electronic materials. The solvents are described in Table 1.

TABLE 1

| | Solvents | | | | | |
|---|---|---|---|---|---|---|
| | Component A | Weight % | Component B | Weight % | Component C | Weight % |
| Example | | | | | | |
| 1 | dimethyl sulfoxide | 64 | ethylene glycol monobutyl ether | 30 | N-formyl morpholine | 6 |
| 2 | dimethyl sulfoxide | 58 | ethylene glycol monobutyl ether | 30 | N-formyl morpholine | 12 |
| 3 | dimethyl sulfoxide | 52 | ethylene glycol monobutyl ether | 30 | N-formyl morpholine | 18 |
| 4 | dimethyl sulfoxide | 65 | ethylene glycol monobutyl ether | 28 | N,N-dimethyl propionamide | 7 |
| 5 | dimethyl sulfoxide | 65 | ethylene glycol monobutyl ether | 20 | N,N-dimethyl propionamide | 15 |
| 6 | dimethyl sulfoxide | 66 | ethylene glycol monobutyl ether | 25 | 3-methoxy-N,N-dimethyl propanamide | 7 |
| 7 | dimethyl sulfoxide | 60 | ethylene glycol monobutyl ether | 25 | 3-methoxy-N,N-dimethyl propanamide | 15 |
| 8 | dimethyl sulfoxide | 65 | ethylene glycol monobutyl ether | 29 | triethyl phosphate | 6 |
| 9 | dimethyl sulfoxide | 65 | ethylene glycol monobutyl ether | 23 | triethyl phosphate | 12 |
| 10 | dimethyl sulfoxide | 65 | ethylene glycol monobutyl ether | 17 | triethyl phosphate | 18 |
| Comparative Example | | | | | | |
| 1 | N-methyl-2-pyrrolidone | 100 | | | | |
| 2 | 3-methoxy-N,N-dimethyl propanamide | 100 | | | | |
| 3 | monoethanolamine | 15 | diethylene glycol butyl ether | 20 | DI water | 65 |
| 4 | monoethanolamine | 30 | diethylene glycol butyl ether | 70 | | |
| 5 | monoethanolamine | 10 | N-methyl-2-pyrrolidone | 70 | DI water | 20 |

Protocols for Examples 1-10 and Comparative Examples 1-5

Poly(amic acid) dissolution: A solution of poly (pyromellitic dianhydride-co-4,4'-oxydianiline), amic acid precursor in NMP is contacted with deionized (DI) water or other NMP-insoluble liquid to extract the precursor from the NMP. The poly(amic acid) precursor is then baked at 54° C. for 4 hours to evaporate any residual solvent/liquid before it is dissolved by contact with the test solvent. Results are recorded after 12 hours at 54° C.

Photoresist stripping: Place 2 milliliters (ml) SFP-1400 photoresist solution onto the surface of glass substrate with a size of 100 millimeters (mm)×100 mm×1 mm. The substrate is spun with a rotation speed of 500 revolutions per minute (rpm) for 10 seconds (s) to spread out the photoresist solution. The rotation speed is then accelerated to 1000 rpm for 30 s to coat the photoresist homogenously and spin out redundant solvent. The coated substrate is heated to evaporate solvent at 130° C. for 10 minutes (min). The stripping step prepares 30 grams (g) example in the container. The baked substrate is placed into the container with shaking, and finally the time is measured for completely removing photoresist from the substrate.

Results

Poly(amic acid) dissolution: The poly (pyromellitic dianhydride-co-4,4'-oxydianiline), amic acid solubility results of each product are reported in Table 2. The content of polymer in each example and comparative sample is 20% by weight. The performance is judged through the fluidity of the solution. The two examples, N-formyl morpholine/N,N-dimethyl propionamide, and dimethyl sulfoxide/N,N-dimethyl propionamide exhibit good fluidity with low viscosity. N-formyl morpholine/3-methoxy-N,N-dimethyl propanamide shows a certain fluidity and suitable viscosity. However, in comparative samples, 3-methoxy-N,N-dimethyl propanamide, gels occur in the solutions, which represents the oversaturation of polymer. For N-methyl-2-pyrrolidone, although the sample is able to flow, its viscosity is comparatively high. In general, the solubility of poly (pyromellitic dianhydride-co-4,4'-oxydianiline), amic acid in N-methyl-2-pyrrolidone should be 15% by weight for commercial products. For 3-methoxy-N,N-dimethyl propanamide, the related solubility is comparatively lower. Therefore, the solvency for poly(amic acid) of examples is better than comparative samples.

TABLE 2

Poly(amic acid) (poly (pyromellitic dianhydride-co-4,4'-oxydianiline), amic acid) Solvency Performance of Solvents

| Example | | | | | | |
|---|---|---|---|---|---|---|
| Component A | Weight % | Component B | Weight % | Component C | Weight % | Performance |
| dimethyl sulfoxide | 64 | ethylene glycol monobutyl ether | 30 | N-formyl morpholine | 6 | ○ |
| dimethyl sulfoxide | 58 | ethylene glycol monobutyl ether | 30 | N-formyl morpholine | 12 | ○ |
| dimethyl sulfoxide | 52 | ethylene glycol monobutyl ether | 30 | N-formyl morpholine | 18 | ○ |
| dimethyl sulfoxide | 65 | ethylene glycol monobutyl ether | 28 | N,N-dimethyl propionamide | 7 | ○ |
| dimethyl sulfoxide | 65 | ethylene glycol monobutyl ether | 20 | N,N-dimethyl propionamide | 15 | ○ |
| dimethyl sulfoxide | 66 | ethylene glycol monobutyl ether | 25 | 3-methoxy-N,N-dimethyl propanamide | 7 | ○ |
| dimethyl sulfoxide | 60 | ethylene glycol monobutyl ether | 25 | 3-methoxy-N,N-dimethyl propanamide | 15 | ○ |
| dimethyl sulfoxide | 65 | ethylene glycol monobutyl ether | 29 | triethyl phosphate | 6 | ○ |
| dimethyl sulfoxide | 65 | ethylene glycol monobutyl ether | 23 | triethyl phosphate | 12 | ○ |
| dimethyl sulfoxide | 65 | ethylene glycol monobutyl ether | 17 | triethyl phosphate | 18 | ○ |

| Comparative | | |
|---|---|---|
| Component | Weight % | Performance |
| N-methyl-2-pyrrolidone | 100 | ○ |
| 3-methoxy-N,N-dimethyl propanamide | 100 | X |

Open circle = fluidity;
X = high viscosity (no flow)

Photoresist stripping: The photoresist stripping results of each combination are listed in Table 3. The performance is evaluated by stripping time. The example, dimethyl sulfoxide/ethylene glycol monobutyl ether/N,N-dimethyl propionamide can completely strip the coated photoresist from the glass substrate within 15 seconds. The other invented dimethyl sulfoxide/ethylene glycol monobutyl ether based examples require 15 to 20 seconds to strip the photoresist. Water based monoethanolamine/diethylene glycol butyl ether and monoethanolamine/N-methyl-2-pyrrolidone comparative samples Dongji (KR1403516B1) need almost a half-minute for stripping. However the other commercial combination, monoethanolamine/diethylene glycol butyl ether without water content shows relatively slow stripping speed. Therefore, the examples possess better stripping performance on SFP-1400 photoresist.

TABLE 3

Photoresist (SFP-1400) Stripping Performance of Solvents

| Component A | Weight % | Component B | Weight % | Component C | Weight % | Performance |
|---|---|---|---|---|---|---|
| Example | | | | | | |
| dimethyl sulfoxide | 64 | ethylene glycol monobutyl ether | 30 | N-formyl morpholine | 6 | ○ |
| dimethyl sulfoxide | 58 | ethylene glycol monobutyl ether | 30 | N-formyl morpholine | 12 | ○ |
| dimethyl sulfoxide | 52 | ethylene glycol monobutyl ether | 30 | N-formyl morpholine | 18 | ○ |
| dimethyl sulfoxide | 65 | ethylene glycol monobutyl ether | 28 | N,N-dimethyl propionamide | 7 | ⊙ |
| dimethyl sulfoxide | 65 | ethylene glycol monobutyl ether | 20 | N,N-dimethyl propionamide | 15 | ⊙ |
| dimethyl sulfoxide | 66 | ethylene glycol monobutyl ether | 25 | 3-methoxy-N,N-dimethyl propanamide | 7 | ○ |
| dimethyl sulfoxide | 60 | ethylene glycol monobutyl ether | 25 | 3-methoxy-N,N-dimethyl propanamide | 15 | ○ |
| dimethyl sulfoxide | 65 | ethylene glycol monobutyl ether | 29 | triethyl phosphate | 6 | ○ |
| dimethyl sulfoxide | 65 | ethylene glycol monobutyl ether | 23 | triethyl phosphate | 12 | ○ |
| dimethyl sulfoxide | 65 | ethylene glycol monobutyl ether | 17 | triethyl phosphate | 18 | ○ |
| Comparative | | | | | | |
| monoethanolamine | 15 | diethylene glycol butyl ether | 20 | DI water | 65 | Δ |
| monoethanolamine | 30 | diethylene glycol butyl ether | 70 | | | X |
| monoethanolamine | 10 | N-methyl-2-pyrrolidone | 70 | DI water | 20 | Δ |

Circle with a dot = less than (<) 15 seconds;
Open circle (i.e., circle without dot) = 15020 seconds;
Triangle - 20-30 seconds; and
X = greater than or equal to (≥) 30 seconds.

Protocols for Examples 11-17 and Comparative Examples 6-10

The solvents are designed to have a freezing point lower than −25° C., and faster photoresist stripping and polyamic acid dissolution than NMP. For each blending example, The detailed ratio for each inventive and comparative example is reported in the Table 4.

TABLE 4

| | Component A | Weight % | Component B | Weight % | Component C | Weight % |
|---|---|---|---|---|---|---|
| Example | | | | | | |
| 11 | dimethyl sulfoxide | 20 | ethylene glycol monobutyl ether | 20 | N,N-dimethyl propionamide | 60 |
| 12 | dimethyl sulfoxide | 10 | ethylene glycol monobutyl ether | 20 | N,N-dimethyl propionamide | 70 |
| 13 | dimethyl sulfoxide | 20 | ethylene glycol monobutyl ether | 30 | N,N-dimethyl propionamide | 50 |
| 14 | dimethyl sulfoxide | 10 | ethylene glycol monobutyl ether | 30 | N,N-dimethyl propionamide | 60 |
| 15 | dimethyl sulfoxide | 30 | ethylene glycol monobutyl ether | 40 | N,N-dimethyl propionamide | 30 |
| 16 | dimethyl sulfoxide | 20 | ethylene glycol monobutyl ether | 40 | N,N-dimethyl propionamide | 40 |
| 17 | dimethyl sulfoxide | 10 | ethylene glycol monobutyl ether | 40 | N,N-dimethyl propionamide | 50 |
| Comparative Example | | | | | | |
| 6 | N-methyl-2-pyrrolidone | 100 | | | | |
| 7 | 3-methoxy-N,N-dimethyl propanamide | 100 | | | | |
| 8 | monoethanolamine | 15 | diethylene glycol butyl ether | 20 | DI water | 65 |
| 9 | monoethanolamine | 30 | diethylene glycol butyl ether | 70 | | |
| 10 | monoethanolamine | 10 | N-methyl-2-pyrrolidone | 70 | DI water | 20 |

Polyamic Acid Dissolution

The procedure of Examples 1-10 and Comparative Examples 1-5 is repeated here.

Photoresist Stripping

The procedure of Examples 1-10 and Comparative Examples 1-5 is repeated here.

Freeze Testing

Twenty gram (20 g) samples are prepared and stored in a refrigerator at −25° C. for 24 hours after which the samples are viewed for liquid or solid (frozen) state.

Results

Polymeric Acid Dissolution

The poly (pyromellitic dianhydride-co-4,4'-oxydianiline), amic acid solubility results of each product are reported in Table 5. The amount of polymer in each example and comparative sample is 30% by weight. The performance is judged through the viscosity of the solution. All dimethyl sulfoxide/ethylene glycol monobutyl ether based solvents can completely dissolve polyamic acid and exhibit good viscosity, which indicates the invented combinations have equivalent performance with N-methyl-2-pyrrolidone. As for the other comparative sample, 3-methoxy-N,N-dimethyl propanamide, the related solubility is comparatively lower. The solution is hard to flow. Therefore, the solvency for polyamic acid of the inventive examples is good relative to certain commercial products.

TABLE 5

Polyamic Acid Solvency Performance of Various Solvents

| Example | | | | | | |
|---|---|---|---|---|---|---|
| Component A | Weight % | Component B | Weight % | Component C | Weight % | Performance |
| dimethyl sulfoxide | 20 | ethylene glycol monobutyl ether | 20 | N,N-dimethyl propionamide | 60 | ○ |
| dimethyl sulfoxide | 10 | ethylene glycol monobutyl ether | 20 | N,N-dimethyl propionamide | 70 | ○ |

TABLE 5-continued

Polyamic Acid Solvency Performance of Various Solvents

| | | | | | | |
|---|---|---|---|---|---|---|
| dimethyl sulfoxide | 20 | ethylene glycol monobutyl ether | 30 | N,N-dimethyl propionamide | 50 | ○ |
| dimethyl sulfoxide | 10 | ethylene glycol monobutyl ether | 30 | N,N-dimethyl propionamide | 60 | ○ |

Comparative

| Component | Weight % | Performance |
|---|---|---|
| N-methyl-2-pyrrolidone | 100 | ○ |
| 3-methoxy-N,N-dimethyl propanamide | 100 | X |

○ = Low Viscosity
X = High Viscosity

Photoresist Stripping

The photoresist stripping results of each combination are reported in Table 6. The performance is evaluated by stripping time. Dimethyl sulfoxide/ethylene glycol monobutyl ester/N,N-dimethyl propionamide can completely strip the coated photoresist from the glass substrate within 15 seconds. The dimethyl sulfoxide/ethylene glycol monobutyl ester based examples require 15 to 20 seconds to strip the photoresist. Water-based monoethanolamine/diethylene glycol butyl ether and monoethanolamine/N-methyl-2-pyrrolidone comparative samples required close to a half minute for stripping. However the other commercial combination, monoethanolamine/diethylene glycol butyl ether without water content shows relatively slow stripping speed. Therefore, the examples possess better stripping performance on SFP-1400 photoresist.

TABLE 6

Photoresist Stripping Performance of the Solvents

| Component A | Weight % | Component B | Weight % | Component C | Weight % | Performance |
|---|---|---|---|---|---|---|
| Example | | | | | | |
| dimethyl sulfoxide | 20 | ethylene glycol monobutyl ether | 20 | N-formyl morpholine | 60 | ○ |
| dimethyl sulfoxide | 10 | ethylene glycol monobutyl ether | 20 | N-formyl morpholine | 70 | ○ |
| dimethyl sulfoxide | 20 | ethylene glycol monobutyl ether | 30 | N-formyl morpholine | 50 | ○ |
| dimethyl sulfoxide | 10 | ethylene glycol monobutyl ether | 30 | N,N-dimethyl propionamide | 60 | ○ |
| dimethyl sulfoxide | 30 | ethylene glycol monobutyl ether | 40 | N,N-dimethyl propionamide | 30 | ○ |
| dimethyl sulfoxide | 20 | ethylene glycol monobutyl ether | 40 | 3-methoxy-N,N-dimethyl propanamide | 40 | ○ |
| dimethyl sulfoxide | 10 | ethylene glycol monobutyl ether | 40 | 3-methoxy-N,N-dimethyl propanamide | 50 | ○ |
| Comparative | | | | | | |
| monoethanolamine | 15 | diethylene glycol butyl ether | 20 | DI water | 65 | Δ |
| monoethanolamine | 30 | diethylene glycol butyl ether | 70 | | | X |

TABLE 6-continued

Photoresist Stripping Performance of the Solvents

| Component A | Weight % | Component B | Weight % | Component C | Weight % | Performance |
|---|---|---|---|---|---|---|
| monoethanolamine | 10 | N-methyl-2-pyrrolidone | 70 | DI water | 20 | Δ |

○ means <20 seconds
Δ means 20 to 30 seconds
X means >30 seconds

Photoresist Stripping (Frozen)

Twenty gram (20 g) solvent samples are placed into fifty milliliter (50 mL) glass cylinders. The solvent-containing glass containers and a thermometer are placed into a refrigerator, and the temperature of the refrigerator is set to −25° C. The samples are kept in the refrigerator at −25° C. for 12 hours. The results are reported in Table 7. The physical state of the solvent, i.e., liquid or solid, is determined by visual inspection of the sample in the glass cylinder. All inventive samples are liquid. Among the comparative examples, 3-methoxy-N,N-dimethyl propanamide and monoethanolamine/diethylene glycol butyl ether are liquid. However, N-methyl-2-pyrrolidone, monoethanolamine/diethylene glycol butyl ether/DI water and monoethanolamine/N-methyl-2-pyrrolidone/DI water are solid.

TABLE 7

Liquid/Solid Status of Solvents are −25° C.

| Component A | Weight % | Component B | Weight % | Component C | Weight % | Performance |
|---|---|---|---|---|---|---|
| *Example* | | | | | | |
| dimethyl sulfoxide | 20 | ethylene glycol monobutyl ether | 20 | N-formyl morpholine | 60 | ○ |
| dimethyl sulfoxide | 10 | ethylene glycol monobutyl ether | 20 | N-formyl morpholine | 70 | ○ |
| dimethyl sulfoxide | 20 | ethylene glycol monobutyl ether | 30 | N-formyl morpholine | 50 | ○ |
| dimethyl sulfoxide | 10 | ethylene glycol monobutyl ether | 30 | N,N-dimethyl propionamide | 60 | ○ |
| dimethyl sulfoxide | 30 | ethylene glycol monobutyl ether | 40 | N,N-dimethyl propionamide | 30 | ○ |
| dimethyl sulfoxide | 20 | ethylene glycol monobutyl ether | 40 | 3-methoxy-N,N-dimethyl propanamide | 40 | ○ |
| dimethyl sulfoxide | 10 | ethylene glycol monobutyl ether | 40 | 3-methoxy-N,N-dimethyl propanamide | 50 | ○ |
| *Comparative* | | | | | | |
| N-methyl-2-pyrrolidone | 100 | | | | | X |
| 3-methoxy-N,N-dimethyl propanamide | 100 | | | | | ○ |
| monoethanolamine | 15 | diethylene glycol butyl ether | 20 | DI water | 65 | X |
| monoethanolamine | 30 | diethylene glycol butyl ether | 70 | | | ○ |
| monoethanolamine | 10 | N-methyl-2-pyrrolidone | 70 | DI water | 20 | X |

○ = Liquid
X = Frozen (Solid)

What is claimed is:

1. A solvent consisting essentially of:
   (A) from 50 to 90 wt% of a first component consisting of a sulfoxide;
   (B) from 9 to 40 wt% of a second component consisting of a glycol ether; and
   (C) from 1 to 30 wt% of 3-methoxy-N,N-dimethyl propanamide, wherein wt % is based on the weight of the solvent.

2. The solvent of claim 1 wherein the sulfoxide is DMSO.

3. The solvent of claim 1 wherein the glycol ether is ethylene glycol monobutyl ether.

4. The solvent of claim 1 wherein the first component is DMSO and the second component is ethylene glycol monobutyl ether.

* * * * *